United States Patent

[11] 3,627,599

[72] Inventors Joel Edward Goldmacher
Cranbury;
Orville Elton Dow, Princeton, both of N.J.

[21] Appl. No. 819,492
[22] Filed Apr. 25, 1969
[45] Patented Dec. 14, 1971
[73] Assignee RCA Corporation

[54] METHOD OF APPLYING AN N,N DIALLYLMELAMINE RESIST TO A SURFACE
4 Claims, No Drawings

[52] U.S. Cl. .......... 156/13, 117/106, 156/17, 96/35.1, 96/115
[51] Int. Cl. .......... G03c 1/70, C23c 13/04
[50] Field of Search .......... 96/115, 36, 35.1; 117/106; 156/17, 13; 204/158; 260/249.6

[56] References Cited

UNITED STATES PATENTS

| | | | |
|---|---|---|---|
| 2,892,807 | 6/1959 | Sellers et al. | 106/288 B |
| 3,375,110 | 3/1968 | Loeb | 96/115 |
| 3,547,683 | 12/1970 | Williams et al. | 117/106 R |
| 3,097,096 | 7/1963 | Oster | 96/35.1 |
| 3,414,433 | 12/1968 | Van Bramer | 117/106 |
| 3,376,138 | 4/1968 | Giangualano et al. | 96/36 |
| 3,406,040 | 10/1968 | Da Silva | 117/06 |
| 3,453,275 | 7/1969 | Grindahl et al. | 204/158 |
| 3,510,371 | 5/1970 | Frankson | 156/17 |

OTHER REFERENCES

Roth et al., " Copolymerizations with Triallyl Isocyannurate and Diallylmelamine" Jour. Polymer Science Vol. 55 pp. 41–48 (1961)

Advances in Organic Chemistry Vol. 5 pp. 2– 5 cited (Parker) Interscience Publishers (1965)

*Primary Examiner*—Robert F. Burnett
*Assistant Examiner*—R. J. Roche
*Attorney*—Glenn H. Bruestle

ABSTRACT: A novel negative resist comprises N,N'diallylmelamine. A film of the N,N'diallylmelamine resist is applied to a surface of a body from the vapor state in an evacuated environment. The deposited film, being soluble in hot water, is converted to a form that is insoluble in boiling water by exposing it to a beam of electrons or of ultraviolet light. The water-insoluble film can be removed, when no longer needed, by dissolving it in boiling dimethylformamide.

By the term "negative resist," as used herein, is meant a material that is hardened, or rendered insoluble in certain solvents, by exposing it to the radiation of a beam of electrons or of electromagnetic waves.

METHOD OF APPLYING AN N,N'DIALLYLMELAMINE RESIST TO A SURFACE

BACKGROUND OF INVENTION

This invention relates to a novel negative resist and a novel method of applying the resist to a surface of a body. More particularly, the invention relates to an N,N'diallylmelamine resist and a novel method of masking predetermined portions of a surface to be protected during a manufacturing process. The novel resist and method of applying it to a surface of a body are particularly useful in processes of manufacturing integrated circuits for the electronic arts.

It has bee proposed to apply resists, such as photoresists, for example, to the surface of a body by coating the body with the resist in a liquid form. Prior art resists have been applied to surfaces by various methods, such as by dipping, spraying, or spinning techniques. When resists, having thicknesses of 1 micron or less, are formed by these prior-art methods, it has been found that the thicknesses of the resists are not sufficiently uniform to meet the exacting requirements of some manufacturing processes. When the prior art resists are exposed to a beam of electrons or of electromagnetic waves, the exposed portions are hardened, but the resolution obtained by the exposure is dependent upon the beam scatter in the resist material. Hence, good uniformity of thickness of the deposited resist is an important prerequisite for obtaining good resolution.

The novel method of the present invention provides a negative type resist of substantially uniform thickness, even with films in the order of 1 micron or less in thickness, and even on surfaces that are nonplanar.

SUMMARY OF THE INVENTION

The novel method of applying the novel negative resist to a body comprises depositing, from the vapor state, a film of N,N'diallylmelamine on the surface of the body. The deposited film is soluble in hot water. The film is converted to a form that is insoluble in boiling water by exposing it to actinic radiation of sufficient energy to effect the conversion. The water insoluble film can be removed, when no longer needed, by dissolving it in dimethylformamide.

The novel resist provided by the novel method has the advantage of being of a substantially uniform thickness, regardless of the contour of the surface to which it is applied. Also, the novel method provides relatively simple means for controlling the thickness of the deposition of the resist by controlling the time of deposition of the resist from the vapor state. The novel resist can be used for providing either an electrically insulating film, as, for example, a dielectric material for a capacitor, or a mask for protecting predetermined portions of a surface of a substrate during a manufacturing process.

DESCRIPTION OF THE PREFERRED EMBODIMENTS

An N,N'diallylmelamine resist, as an electrically insulating film is applied to a major surface of a body in the following manner: The body may be 1 square inch wafer substrate of silicon, for example, disposed in an evacuated environment, such as an evacuated bell jar. A boat containing about 1 to 2 grams of the chemical compound N,N'diallylmelamine is also disposed within the evacuated environment and heated to a temperature of between about 75° C. and 175° C. The N,N'diallylmelamine sublimes at about 100° C. and condenses as a film on the surface of the substrate. A film of about 0.5 microns in thickness can be formed in 5 to 10 minutes. The base air pressure in the evacuated environment is within a range between about $10^{-6}$ and $10^{-5}$ torr. The thickness of the N,N'diallylmelamine resist can be controlled by controlling the rate of deposition, that is, controlling the temperature of the boat, and the time of deposition. The deposited resist is not soluble in isopropyl alcohol, acetone, or toluene at room temperature, but it is soluble in hot water of at least 50° C.

The deposited N,N'diallylmelamine resist can be hardened and converted to a form that is insoluble in boiling water by exposing it to actinic radiation, such as that of a beam of electrons or ultraviolet light of sufficient energy to effect the conversion. If exposed to an electron beam, the beam should provide a charge density of at least $6\times10^{-4}$ coulombs/cm.$^2$ at the resist. If, however, the resist is exposed by a beam of ultraviolet light, the wavelength of such radiation should be 2,500 A. or shorter. The intensities of the beams of electrons and ultraviolet light determine the time of exposure necessary to harden the resist. The more intense the beams, the shorter the exposure will be.

As an example of the novel method of applying the N,N'diallylmelamine resist to a surface for masking predetermined portions of the surface during a manufacture process, let it be assumed that it is desired to form a raster of parallel lines of aluminum on the surface of a semiconductor wafer. Let it be assumed also that the lines of aluminum are to be 1 micron wide and spaced from each other by a distance of 1 micron. An aluminum film is deposited on one surface of the wafer from the vapor state in an evacuated environment of between about $10^{-6}$ and $10^{-5}$ torr. The thickness of the film may be between 0.5 and 1.0 micron for example. A film of N,N'diallylmelamine, the negative resist, is deposited on the aluminum film, also from the vapor state in the evacuated environment.

The wafer, with the deposited aluminum and N,N'diallylmelamine films thereon, is placed in an evacuated chamber equipped with means to provide a scanning electron beam therein. The electron beam is deflected, as by prior programming or any other means known in the art, to draw lines, of 1 micron in width and spaced 1 micron from each other, on the surface of the N,N'diallylmelamine film resist. The beam current and the sweep velocity of the beam are adjusted so that the resist is exposed with a charge density of at least $6\times10^{-4}$ coulombs/cm.$^2$. An electron beam, for example, of $5\times10^{-9}$ amperes at 15 KV, having a writing speed of 0.1 cm./sec. and a diameter of $10^{-4}$ cm. will provide a charge density of about $6\times10^{-4}$ coulombs/cm.$^2$.

The silicon wafer is washed in hot water of at least 50° C. to dissolve the unexposed portions of the N,N'diallylmelamine resist, exposing line portions of the aluminum film. The portions of the N,N'diallylmelamine resist that have been exposed to the radiation of the electron beam have been cross-linked, that is, polymerized. The exposed portions of the resist are insoluble even in boiling water, and they protect the line portions of the aluminum film beneath them. The unprotected lines of the aluminum film are dissolved in an alkali solution, such as 10 percent aqueous solution of sodium hydroxide or potassium hydroxide. The wafer with the polymerized resist thereon is washed and dried. The polymerized resist remaining on the aluminum lines can be removed, if no longer needed, with a solution of boiling dimethylformamide, leaving a raster of aluminum lines each 1 micron wide and spaced from each other by a distance of 1 micron.

The foregoing method of applying the N,N'diallylmelamine resist for masking predetermined portions of a surface could be carried out with a beam of ultraviolet light, preferably of a wavelength shorter than 2,500 A., instead of an electron beam. The photon energy of such a beam would be at least 5 ev. and cause the N,N'diallylmelamine monomer to polymerize, thereby converting the resist from a hot water soluble one to one that is insoluble in boiling water.

We claim:

1. In a process of manufacturing wherein predetermined portions of a surface of a semiconductor body are to be protected and other portions are to be exposed, the method of applying a negative resist to said predetermined portions of said surface comprising the steps of:

depositing by condensation, from the vapor state in an evacuated environment, a film of N,N'diallylmelamine on said surface, the deposited film being soluble in hot water of at least 50° C., exposing only predetermined portions of said film, over said predetermined portions of said surface to be protected, to radiation of an electron beam or of ultraviolet light of sufficient energy to convert said film to a form that is insoluble in said hot water, and dissolving unexposed portions of said film with said hot water, whereby to leave only said predetermined portions of said film over said predetermined portions of said surface to be protected and processing the exposed areas of said semiconductor body.

2. In a process of manufacturing as described in claim 1, said step of exposing said film to radiation comprising subjecting said film to the radiation of an electron beam providing a charge density of at least $6\times10^{-4}$ coulombs/$cm.^2$ on said film.

3. In a process of manufacturing as described in claim 1, said step of exposing said film to radiation comprising subjecting said film to the radiation of ultraviolet light having a wavelength shorter than 2,500 A.

4. In a process of manufacture wherein an aluminum film deposited on a semiconductor body is coated with a resist of N,N'diallylmelamine as described in claim 1, exposing predetermined portions of said resist to sufficient radiation to convert said resist portions into a form insoluble in hot water, removing the unexposed resist by washing in hot water to expose the unprotected portions of the aluminum film, etching the exposed aluminum film and subsequently removing the water insoluble portions of said resist by dissolving in dimethylforamide.

* * * * *